(12) United States Patent
Oakley

(10) Patent No.: US 8,981,791 B2
(45) Date of Patent: Mar. 17, 2015

(54) ADAPTIVE FREQUENCY-DOMAIN WINDOWING

(71) Applicant: Peter Q. Oakley, Langley, WA (US)

(72) Inventor: Peter Q. Oakley, Langley, WA (US)

(73) Assignee: Fluke Corporation, Everett, WA (US)

(*) Notice: Subject to any disclaimer, the term of this patent is extended or adjusted under 35 U.S.C. 154(b) by 217 days.

(21) Appl. No.: 13/875,976

(22) Filed: May 2, 2013

(65) Prior Publication Data

US 2014/0327451 A1    Nov. 6, 2014

(51) Int. Cl.
*G01R 31/08* (2006.01)
*H04B 3/46* (2006.01)

(52) U.S. Cl.
CPC ...... *H04B 3/487* (2015.01); *H04B 3/46* (2013.01); *G01R 31/088* (2013.01)
USPC ............................ 324/628; 324/512; 324/527

(58) Field of Classification Search
CPC ...... G01R 31/11; G01R 31/083; G01R 27/28; G01R 31/088; G01R 31/001; G01R 31/08; G01R 31/021; H04B 1/1027; H04B 3/46; H04B 3/464; H04B 17/00; H04B 1/38; H04B 3/23; H04B 3/487; H04N 7/10; H04N 7/17309; H04N 21/2408; H03H 21/0012; G01M 11/3172; G01N 2021/213

See application file for complete search history.

(56) References Cited

U.S. PATENT DOCUMENTS

| | | | | |
|---|---|---|---|---|
| 5,532,603 | A * | 7/1996 | Bottman | 324/628 |
| 5,698,985 | A * | 12/1997 | Bottman | 324/628 |
| 6,433,558 | B1 * | 8/2002 | Sciacero et al. | 324/628 |
| 7,295,018 | B2 | 11/2007 | Oakley | |
| 2005/0225329 | A1 * | 10/2005 | Oakley | 324/533 |
| 2013/0093434 | A1 | 4/2013 | Peyton et al. | |

OTHER PUBLICATIONS

European Search Report for European Patent Application No. 14166799.8, dated Oct. 7, 2014.

* cited by examiner

*Primary Examiner* — Vinh Nguyen
(74) *Attorney, Agent, or Firm* — Locke Lord LLP; Scott D. Wofsy; Christopher J. Capelli

(57) ABSTRACT

A method, apparatus and software related product are presented for adaptive frequency-domain windowing to determine a time-domain crosstalk in a cable and produce effective TDX plots regardless of the frequency of a worst NEXT (near-end crosstalk). An adaptive window such as a low pass or pass band window may be selected based on the frequency of a measured worst NEXT margin for each pair combination.

20 Claims, 11 Drawing Sheets

ADAPTIVE FREQUENCY-DOMAIN WINDOWING

FIELD OF THE INVENTION

The invention relates to a method and apparatus for diagnosis of faults in electric cables, and more specifically, to adaptive frequency-domain windowing for determining time-domain crosstalk in a cable.

BACKGROUND OF THE INVENTION

This section is intended to provide a background or context to the embodiments disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

Time Domain Crosstalk (TDX) is used to diagnose faults in multi-conductor twisted-pair cabling. The measured TDX can be used to display the crosstalk between pairs versus time. Because the signal propagation velocity is known, the time location of a crosstalk can be converted to a distance, and the crosstalk's position along the length of the cable may be determined.

The stimulus and data collection for the TDX can be done directly in the time domain, but it can also be derived from frequency-domain measurements via FFT (Fast Fourier Transform) or other transform techniques. Frequency domain measurements can typically be performed with higher performance and less expensive hardware. Additionally, frequency domain data may be needed for standards-compliant testing of near-end crosstalk (NEXT) such that the TDX can exploit data from a NEXT measurement sweep.

The TDX may be generated from frequency domain measurements. First, the near-end crosstalk (NEXT) is preferably measured at a number of discrete frequencies. To do this, a single-frequency sinusoidal source voltage is injected into a wire pair at one end of the cable. The resulting voltage on a second wire pair at the same cable end is measured for magnitude and phase. It is noted this second wire pair may be referred to as the victim pair. The complex ratio of the voltage on the victim pair to the voltage on the source pair is the NEXT for that combination of pairs. The NEXT measurement may be repeated for a large number (typically hundreds) of frequencies. All these measurements are preferably collected into a measurement vector.

A plot of the results of a NEXT measurement as a function of frequency (curve 10) is shown in FIGS. 1A and 1B where curves 10 and 10$a$ are respectively extending from zero to 800 MHz. A curve 12 in both FIGS. 1A and 1B represent an example of an industry standard test limit extending from zero to 500 MHz. A vertical scale in FIGS. 1A and 1B represents a loss in the NEXT measurements using positive dB units. With reference to FIG. 1A, what is shown is a NEXT margin between the curves 10 and 12 as being relatively small and distinctly positive only below 200 MHz. In FIG. 1B the NEXT margin between the curves 10$a$ and 12 is relatively larger than in FIG. 1A and distinctly positive below 500 MHz, such that the worst margin occurs at high frequencies near 500 MHz.

Typically, a next step is to window the measurement. It is to be appreciated windowing is an element-wise multiplication of the measurement vector by a same-length window vector. Without windowing, the measurement vector contains a step discontinuity at one or both ends of the frequency range resulting in confusing Gibbs' phenomenon oscillations after transformation to the time domain. The windowing smoothly tapers the end of the measurement vector to eliminate the step discontinuities. A plot of a conventional smoothing low pass window function 14 (using arbitrary units) as a function of frequency is shown in FIG. 2.

After windowing, the windowed data is transformed to the time domain to create a TDX plot. The transformation may be accomplished by a conventional method such as an Inverse Fourier Transform (IFFT). An alternative to the IFFT for this application, which also compensates for the cable's attenuation and dispersion (when different frequency components propagate through the cable at different speeds), is a method taught in U.S. Pat. No. 7,295,018 using a loss and distortion technique which is incorporated herein by reference in its entirety. An example of a curve 16 depicting dependence of a TDX (generated by transforming the windowed data) in units 10'V/V (on vertical scale) as a function of a sample point in time domain is shown in FIG. 3. A prominent peak 18 appears near the $30^{th}$ sample point (in time domain). This may be caused by a localized source of crosstalk at that location in the cable.

SUMMARY OF THE INVENTION

The purpose and advantages of the invention will be set forth in and apparent from the description that follows. Additional advantages of the invention will be realized and attained by the devices, systems and methods particularly pointed out in the written description and claims hereof, as well as from the appended drawings.

An aspect of the illustrated embodiments disclosed herein relate to a method, apparatus and/or system for receiving crosstalk measurement results having amplitude and phase crosstalk information regarding a cable. One or more worst margin frequencies are determined at which the crosstalk measurement results presented in a frequency domain have corresponding one or more worst margins relative to a reference value. A variable frequency pass window is chosen among a plurality of windows, the chosen variable frequency pass window preferably maximizing signal transmission at the determined one or more worst margin frequencies. The measurement results presented in the frequency domain are preferably transformed into a time domain using the chosen variable frequency pass window.

BRIEF DESCRIPTION OF THE DRAWINGS

The accompanying drawings illustrate various non-limiting, illustrative, inventive aspects in accordance with the present disclosure.

DETAILED DESCRIPTION OF CERTAIN EMBODIMENTS

Figure 1A:
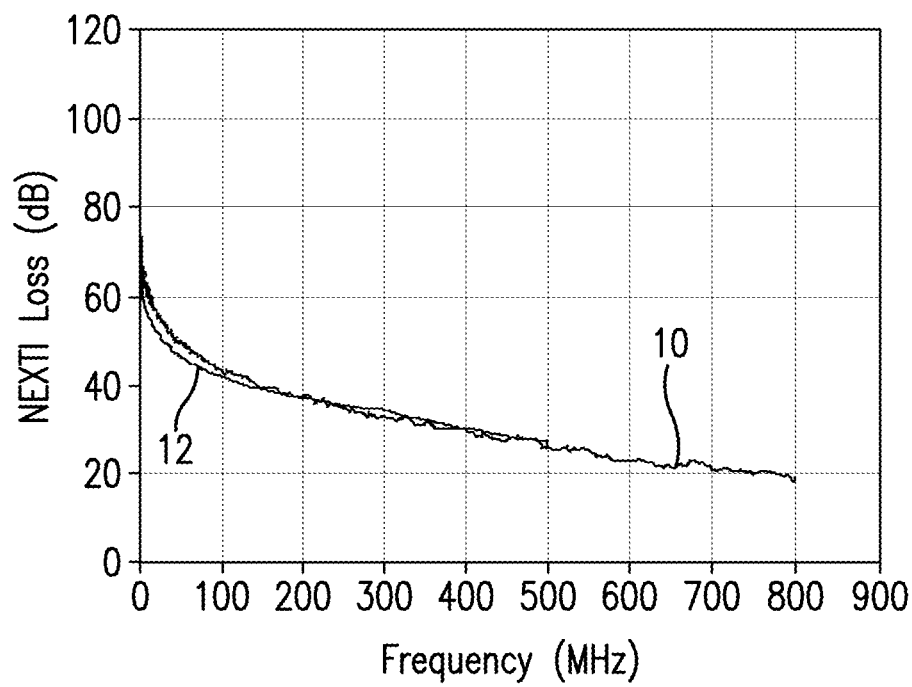
FIGS. 1A and 1B depict examples of a measured NEXT and industry standard test limit in frequency domain.

The present invention is now described more fully with reference to the accompanying drawings, in which illustrated embodiments of the present invention are shown. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. Any publications mentioned herein are incorporated herein by reference to disclose and describe the methods and/or materials in connection with which the publications are cited.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

It is to be appreciated that conventional approaches to TDX signal processing have used frequency domain windows which are fixed to the low pass type while typically having a fixed bandwidth. The window, being low pass in nature, emphasizes low frequencies and de-emphasizes (attenuates) high frequencies. This may become a problem if the cabling's total crosstalk is dominated by the crosstalk at high frequencies—the window can attenuate the dominant crosstalk and it no longer will appear in the time domain data. This may create a problem for detecting crosstalk originating in recently designed types of modular RJ45 connectors. These connectors typically have internal crosstalk compensation structures which are intended to reduce crosstalk. It is noted the compensation may not always be successful. In some unsuccessful cases the compensation structures do improve crosstalk at low frequencies, but render crosstalk worse at high frequencies. In some cases the high frequency crosstalk is bad enough that the cabling fails the frequency domain NEXT limit.

Figure 4:
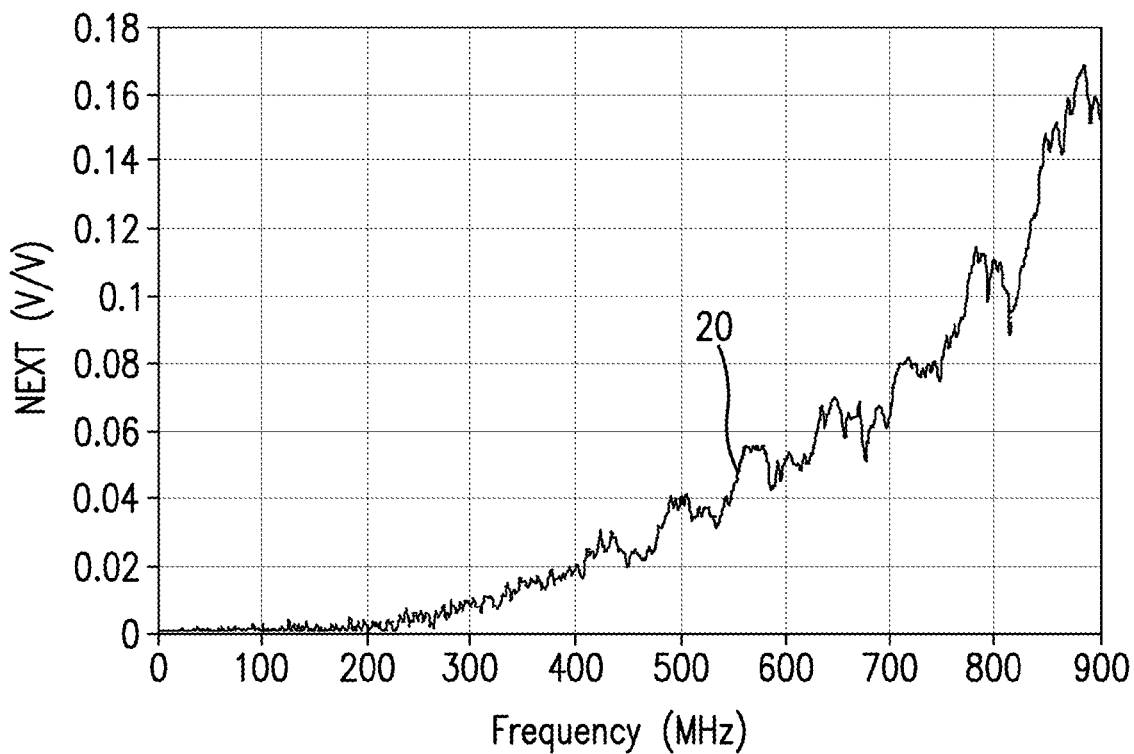
FIG. 4 depicts an example of a measured NEXT as in FIG. 1B but using a linear scale.
Figure 5:
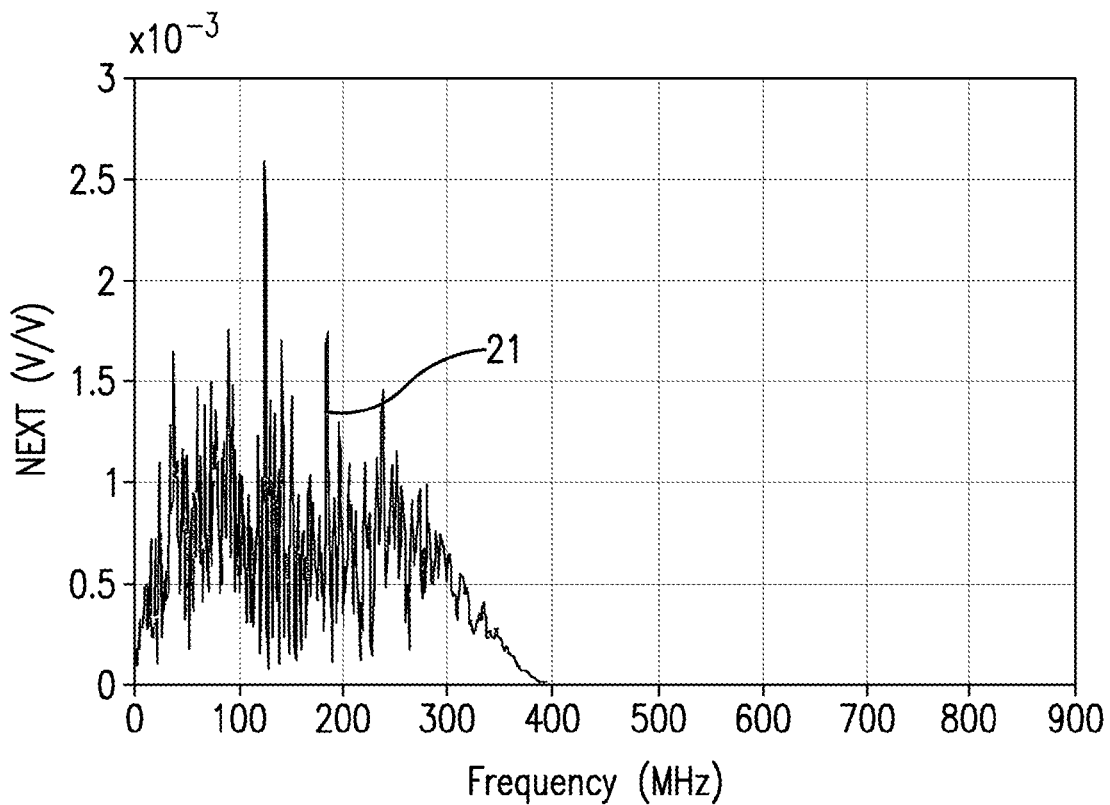
FIG. 5 depicts an example of a measured NEXT as in FIG. 4 multiplied by a LP window function shown in FIG. 2.
Figure 6:
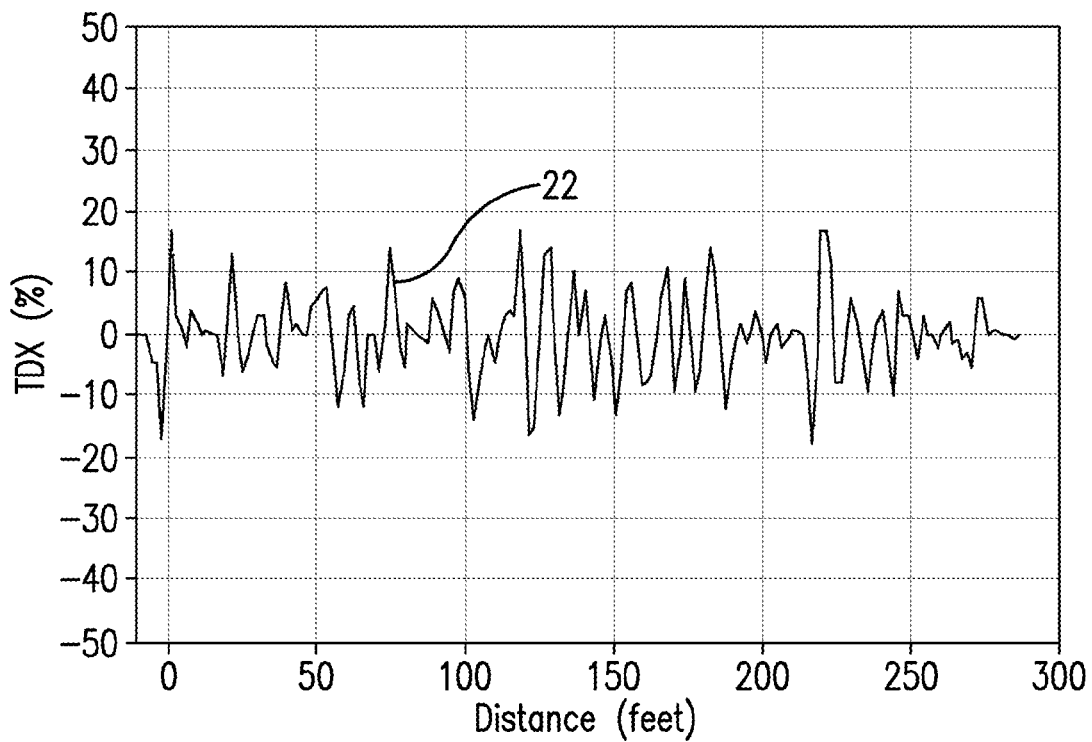
FIG. 6 depicts an example of a TDX trace resulting from transforming the windowed NEXT shown in FIG. 5.

It is to be appreciated that if a low pass window is used in such scenarios, it is not possible to determine the physical location of the crosstalk since the dominant crosstalk has been attenuated by the window, which is demonstrated in FIGS. 4-6.

Figure 1B:
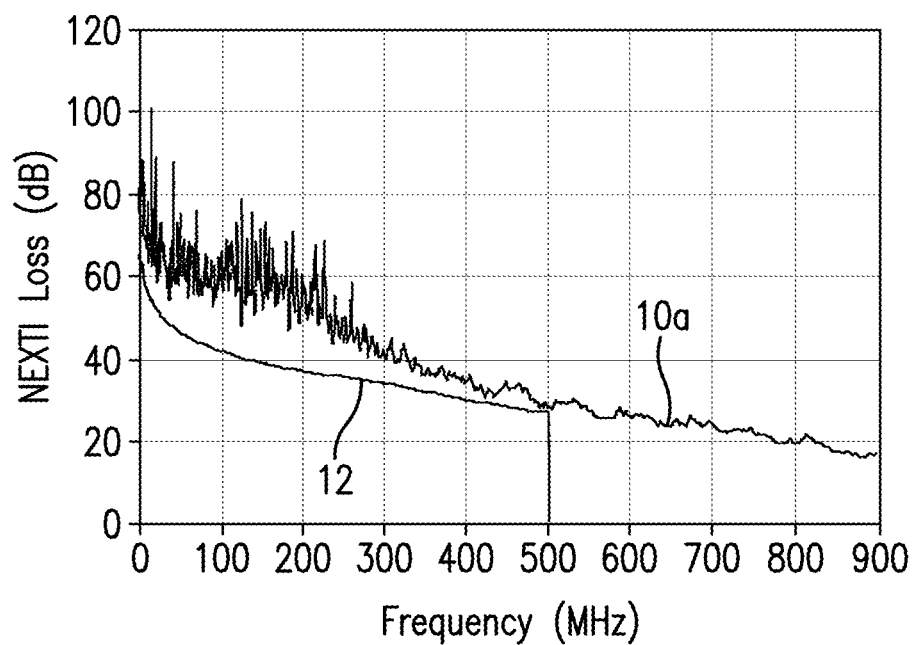
Figure 2:
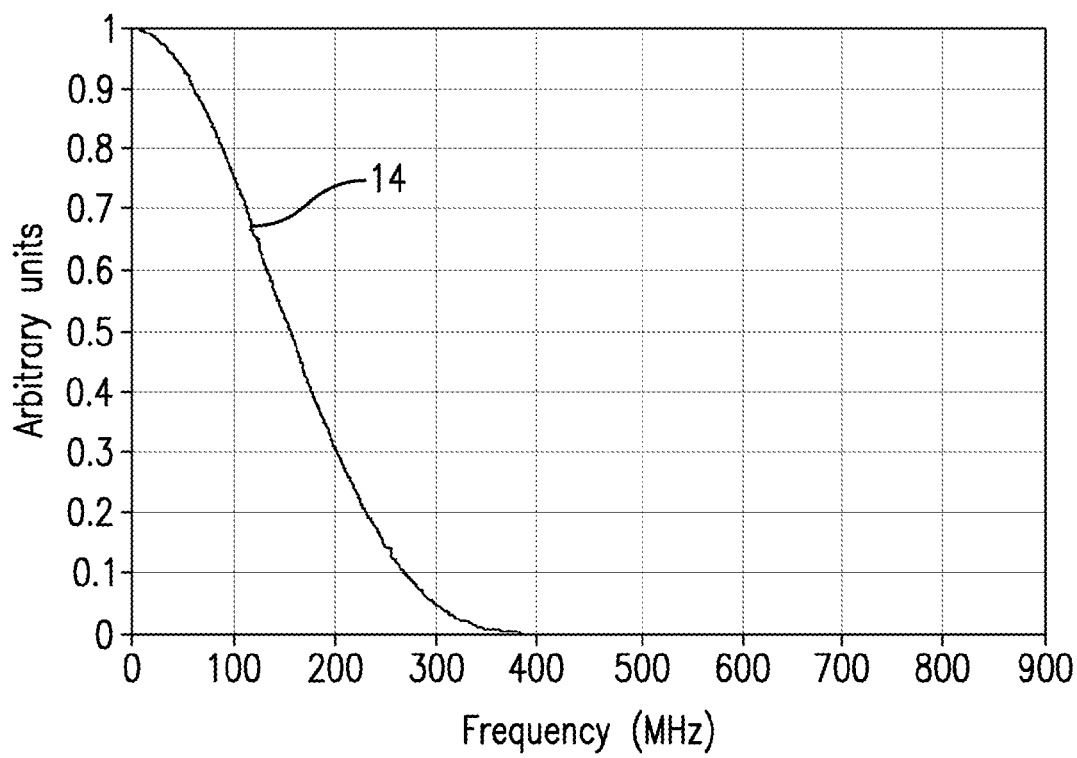
FIG. 2 depicts an example of a low pass window function.
Figure 3:
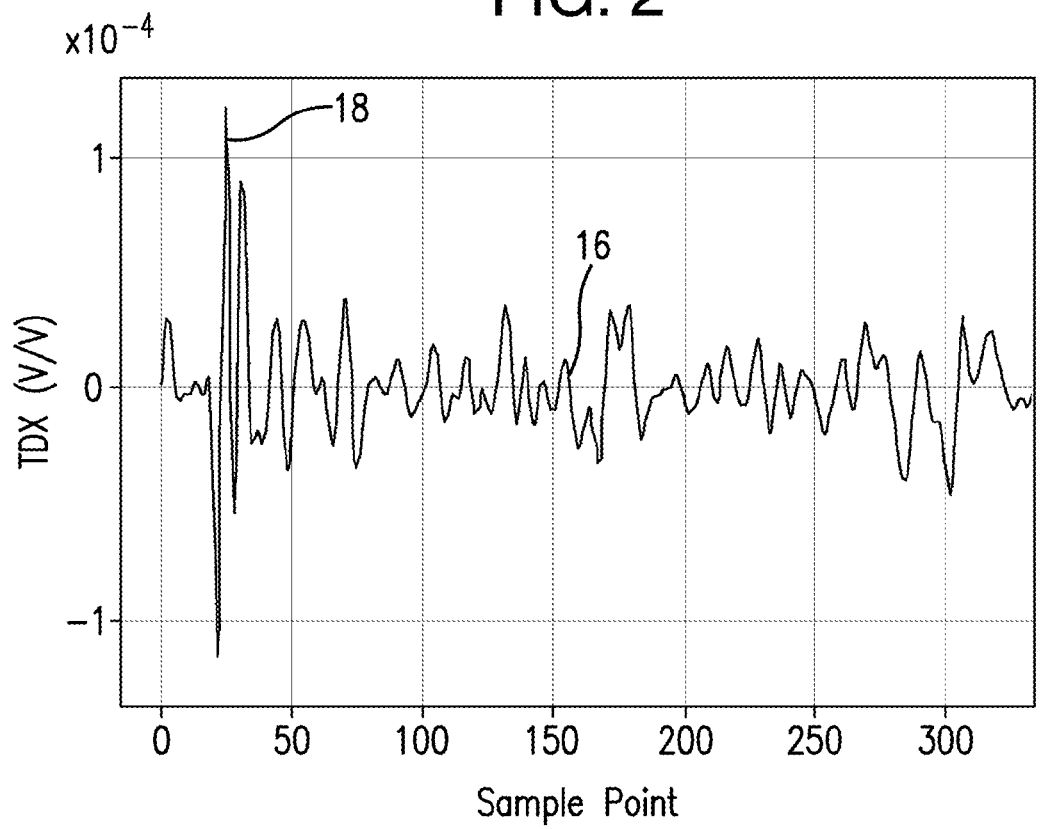
FIG. 3 depicts an example of a TDX plot.

FIG. 4 shows a plot of a NEXT curve 20 with a vertical scale for the NEXT expressed in volt-per-volt which corresponds to the curve 10a shown in FIG. 1B. As illustrated, the NEXT increases with the frequency, especially above 500 MHz. However, when the measured NEXT shown in FIG. 4 is multiplied by the low pass (LP) window function shown in FIG. 2, the resulting curve 21 is shown in FIG. 5, where the worst NEXT, which was near and above 500 MHz, is removed by the LP window. Thus, valuable information regarding a source of crosstalk at high frequencies near and above 500 MHz is lost. This is demonstrated in FIG. 6 illustrating a TDX trace 21 resulted from transforming the windowed NEXT of FIG. 5 into the time domain. It is to be appreciated the LP window removed the worst NEXT near and above 500 MHz such that there is no prominent TDX response spike to reveal a location of the crosstalk fault.

It is thus desirable to overcome the aforementioned drawback (the crosstalk being attenuated by the low pass window at high frequencies) by providing more efficient and accurate way to diagnose faults in electric cables as disclosed in the various illustrative embodiments described herein.

A method, apparatus/system and software related product (e.g., a computer readable memory) are presented for adaptive frequency-domain windowing to determine a time-domain crosstalk in a cable and produce effective TDX plots regardless of the frequency of a worst NEXT (near-end crosstalk). Preferably, an adaptive window such as low pass (LP) or pass band (PB) window may be selected, for example, based on the frequency of a measured worst NEXT margin for each pair combination (the NEXT may be measured using at least two wire pairs in the cable).

According to one embodiment, an apparatus may receive crosstalk measurement results such as NEXT measurement results in a frequency or time domain having amplitude and phase crosstalk information regarding the cable. A determination may then be made of one or more of worst margin frequencies at which the crosstalk measurement results presented in the frequency domain have corresponding one or more worst margins relative to a reference value (such as an industry standard test limit). Based on this determination, an apparatus may further choose a variable frequency pass window (low pass or band pass) among a plurality of windows. The variable frequency pass window may be chosen to maximize signal transmission at the determined one or more worst margin frequencies. This may be followed by transforming the measurement results presented in the frequency domain into a time domain using the chosen variable frequency pass window.

For instance, and in accordance with an illustrated embodiment, the following steps may be followed for each pair combination to select the pair combination's window using a frequency-based approach:

1. Collect frequency domain NEXT measurements at discrete frequencies up to a maximum frequency, $f_{max}$;

2. Find a frequency (or frequencies) of worst NEXT margin, $f_{worst}$; it is to be appreciated that there may be more than one $f_{worst}$ depending on the criterion used for defining unacceptable level for the NEXT margin;
3. Choose a low pass (LP) or band pass (BP) frequency window such that the window's transmission may be maximized (or substantially maximized) at $f_{worst}$ using a predefined algorithm as further discussed herein. It is to be appreciated that a Blackman family of windows may be used to choose from, but other window families could be used as well.

In a scenario concerning a pulsed based approach, the measurements may preferably be performed in a time domain using a pulsed-based apparatus. In this approach, the time domain measurement results may be transformed into a frequency domain using for example a Fourier Transform or a Fast Fourier Transform (FFT) technique thus generating results equivalent to the results generated in step 1 above for the frequency-based approach. Then steps 2 and 3 described above for the frequency-based approach may be performed for a pulsed-based approach as well.

Preferably, to simplify subsequent processing, the widows chosen among LP and BP windows may have a specific number of frequency samples, $N_{samples}$. For example, $N_{samples}$ may be less than or equal to the total number of measurements collected in step 1 for a frequency-based approach. Several examples for choosing the variable window are presented below.

Figure 7:
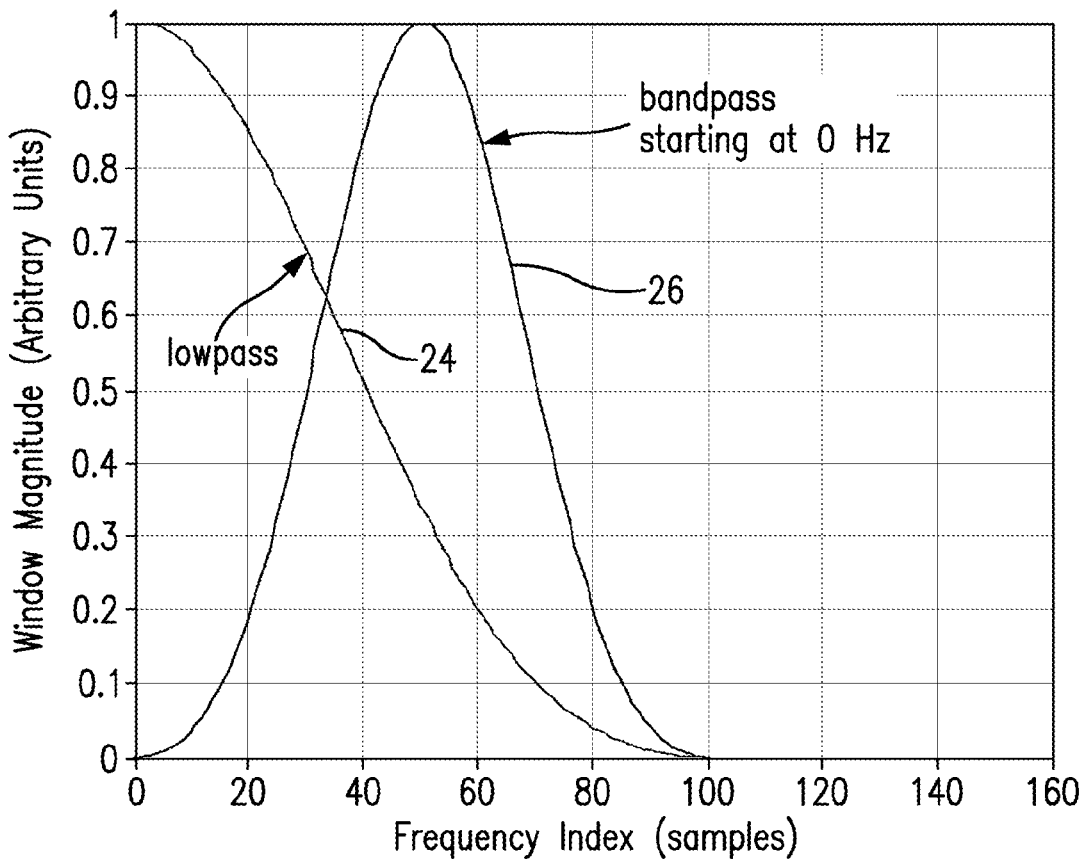
FIGS. 7-9 depict examples for choosing the variable window, according to various embodiments.

In one illustrative example, and as shown in FIG. 7, the choice may be made between a LP window represented by a curve 24 versus a BP Blackman window represented by a curve 26 both having a size of $N_{samples}$ (e.g., 100 samples, where one sample corresponds to one frequency index increment), where the BP window's lower edge starts at 0 Hz and the LP window is of a greater magnitude for all frequencies below $0.334 \times N_{samples}$. Therefore, if $f_{worst}$ is below $0.334 \times N_{samples}$, the LP window 24 may be chosen. And if $f_{worst}$ is between values of $0.334 \times N_{samples}$ and $N_{samples}/2$, the BP window 26 starting at 0 Hz may be chosen.

Figure 8:
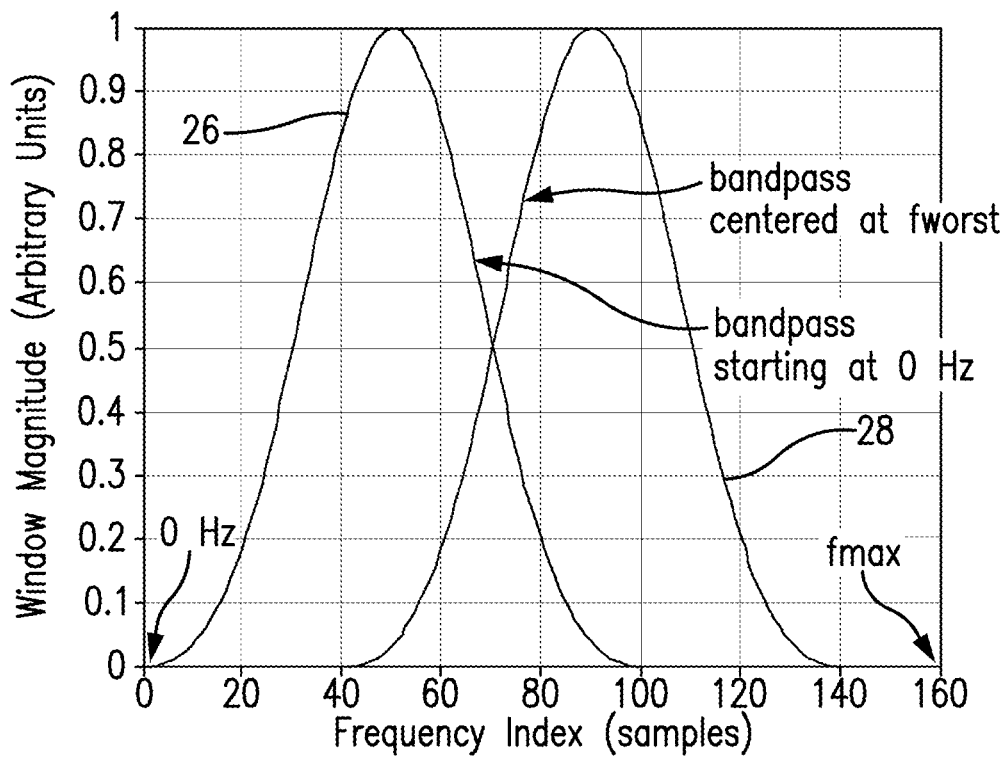

In another illustrative example, and as shown in FIG. 8, the choice may be made between two BP Blackman windows represented by curves 26 (the same as the BP window in FIG. 7) and 28 both having a size of $N_{samples}$, where the BP window 28 is 100 samples wide between frequency indexes 40 and 140 respectively. In this scenario, if $f_{worst}$ is between $0.334 \times N_{samples}$ and $N_{samples}/2$, the BP window 28 may preferably be chosen.

Figure 9:
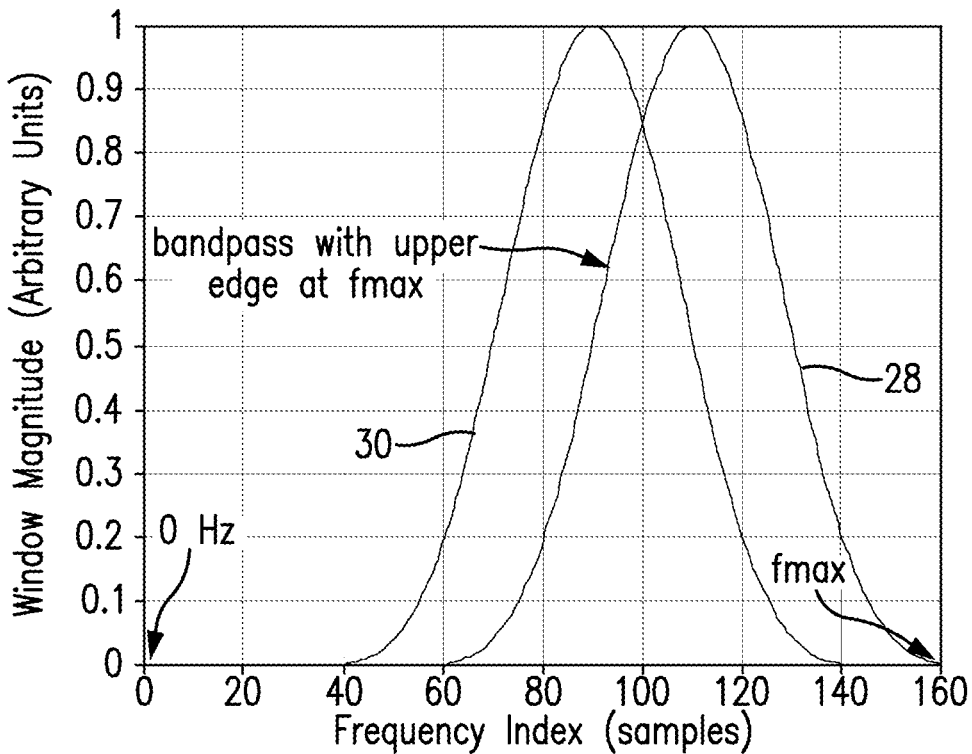

In yet another illustrative example, and as shown in FIG. 9, the choice may be made between two BP Blackman windows represented by curves 28 (the same as the BP window in FIG. 8) and 30 both having the size of $N_{samples}$, where the BP window 30 is 100 samples wide between frequency indexes 60 and 160 ($f_{max}$) respectively. In this scenario, if $f_{worst}$ is above $f_{max} - N_{samples}/2$, the BP window 30 may be chosen.

After the adaptive window is selected, it may be applied to the measured/generated frequency data. The data is then transformed into the time domain. In one option, an inverse FFT may be used for this transformation. Alternatively, the method taught in a U.S. Pat. No. 7,295,018 using a loss and distortion technique may be employed, which is incorporated herein by reference in its entirety. It is appreciated that the embodiments described herein enable compensation for a cable's attenuation and dispersion distortions.

Scaling aspects according to other embodiments are further discussed herein. It is noted that since conventional methods used fixed windows, those windows admitted a fixed amount of crosstalk from the hypothetical point source. Therefore the scaling could be fixed per a test limit. Such a fixed scaling method is taught in a U.S. Pat. No. 5,698,985.

It is to be appreciated that the various embodiments presented herein utilize adaptive, variable windows. These varying windows admit varying amounts of crosstalk from the hypothetical point source. Therefore the scaling may be varied based on the window chosen as well as on the test limit. The computation of the scaling factor may begin with a model of the hypothetical point source. Then the minimum modeled capacitance which will fail NEXT for the present test limit may be further computed. The modeled NEXT may preferably be windowed using the window selected using the criteria discussed above. The windowed modeled NEXT transformed to the time domain, may produce an impulse of a height that depends on the chosen window and the test limit. Finally the scale factor which raises this impulse height to 50 units on the TDX scale may be computed, and that scale factor may be applied to all the transformed measured NEXT data, as further described herein.

Figure 10:
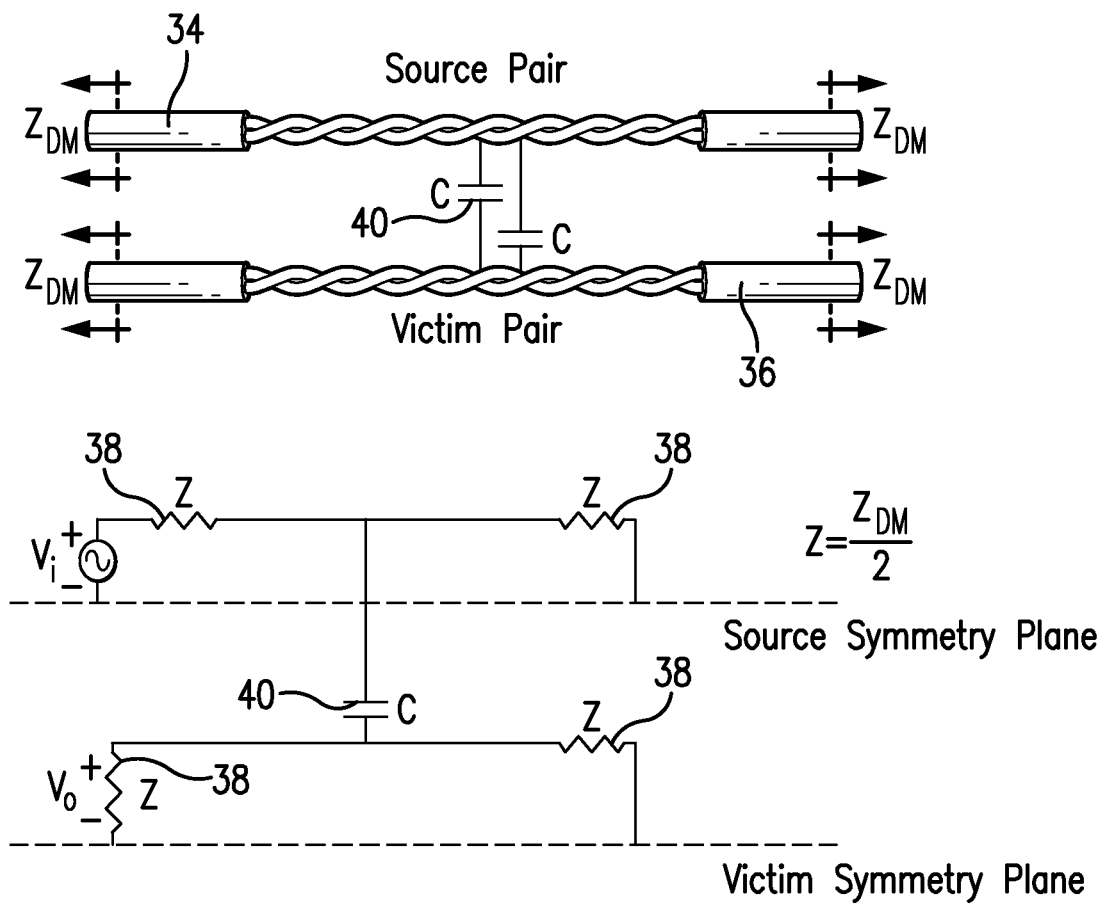
FIG. 10 depicts an example demonstrating a point crosstalk modeled as a capacitance.

The crosstalk at a particular point in the cable having a source pair 34 and a victim pair 36 may be modeled as arising from a differential capacitance 40 (capacitance bridges from one pair to another) at that point as demonstrated in FIG. 10. A stimulus $V_i$ is applied to the first pair (the source pair 34) and the induced voltage $V_o$ is measured on the second pair (the victim pair 36).

For a real Z (such as termination resistors 38), and since capacitance 40 is real, it may be shown that the magnitude of the NEXT from this model is given by:

$$|\text{NEXT}| = \sqrt{\frac{(\omega CZ)^2}{4(1 + (\omega CZ)^2)}} \,. \tag{1}$$

Inverting Equation 1 yields C as follows:

$$C = \frac{1}{\omega Z} \frac{2|\text{NEXT}|}{\sqrt{1 - 4|\text{NEXT}|^2}}. \tag{2}$$

It is appreciated that cables may be tested against a great variety of test limit standards. Some standards extend only to low frequencies, such as 16 MHz, whereas others extend to 500 MHz or more. It is noted the slopes of standards vary and a standard can have even an abrupt change of slope in the middle. In providing a unified approach to these disparate standards, it is to be understood a "minimum capacitance to fail" is introduced. This is the smallest value of capacitance 40 in the coupling model demonstrated in FIG. 10 which will create NEXT which fails the presently selected test limit with a zero margin, as to be discussed below with reference to FIGS. 11-14.

Figure 11:
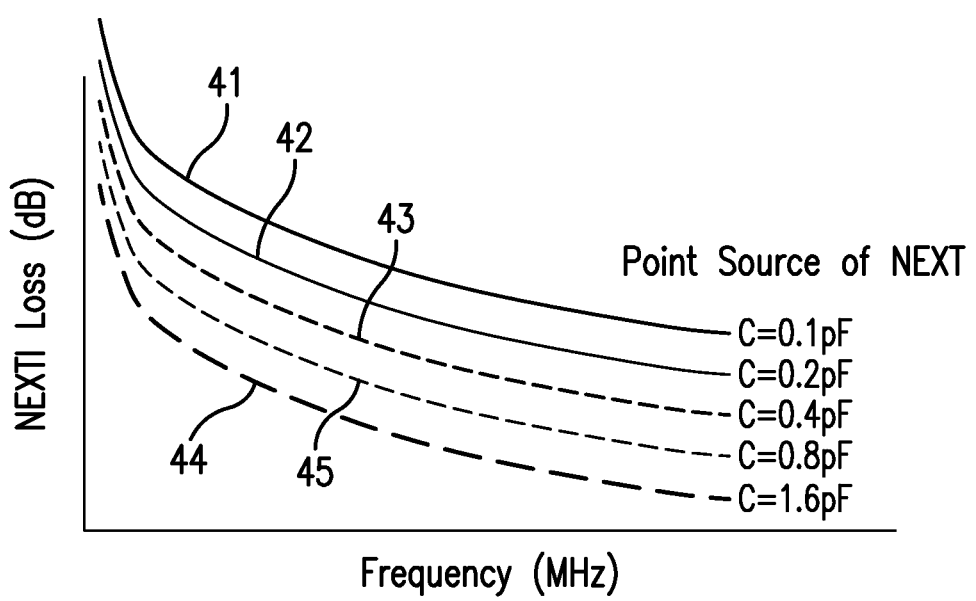
FIG. 11 depicts an example demonstrating how varying a capacitance can produce varying NEXT in the coupling module.

Staring at FIG. 11, illustrated is an example of varying capacitance (see curves 41-45) produces varying NEXT loss (vertical axis) as a function of frequency with different slopes in the coupling model.

Figure 12:
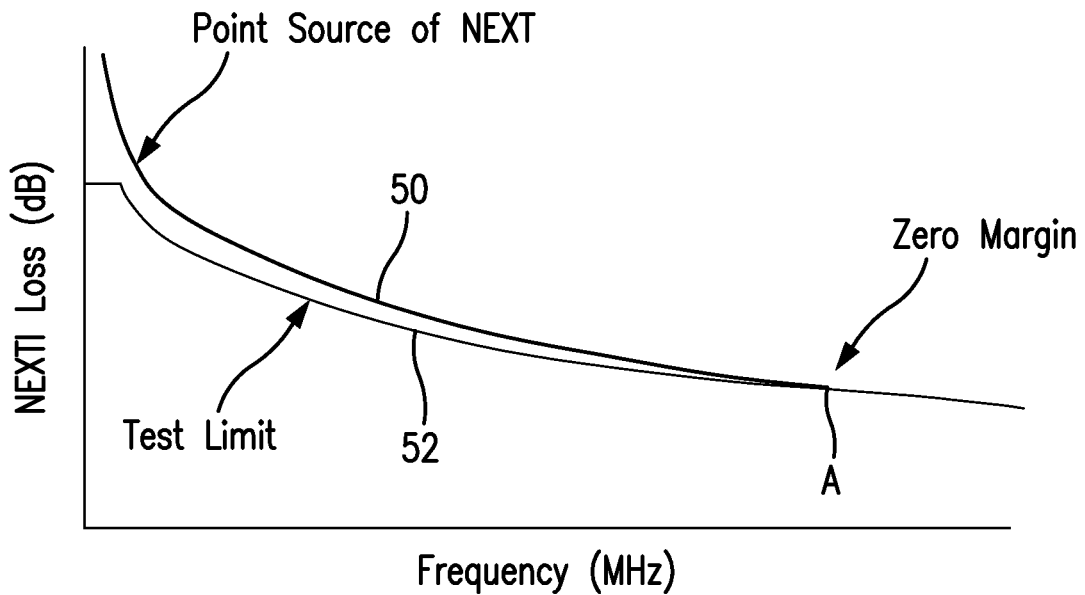
FIGS. 12-14 depict examples of different test limit slopes.

FIG. 12 demonstrates an example of a test limit (curve 52) and a NEXT loss (curve 50) as a function of frequency with a relatively shallow slope and a zero margin at a point A.

Figure 13:
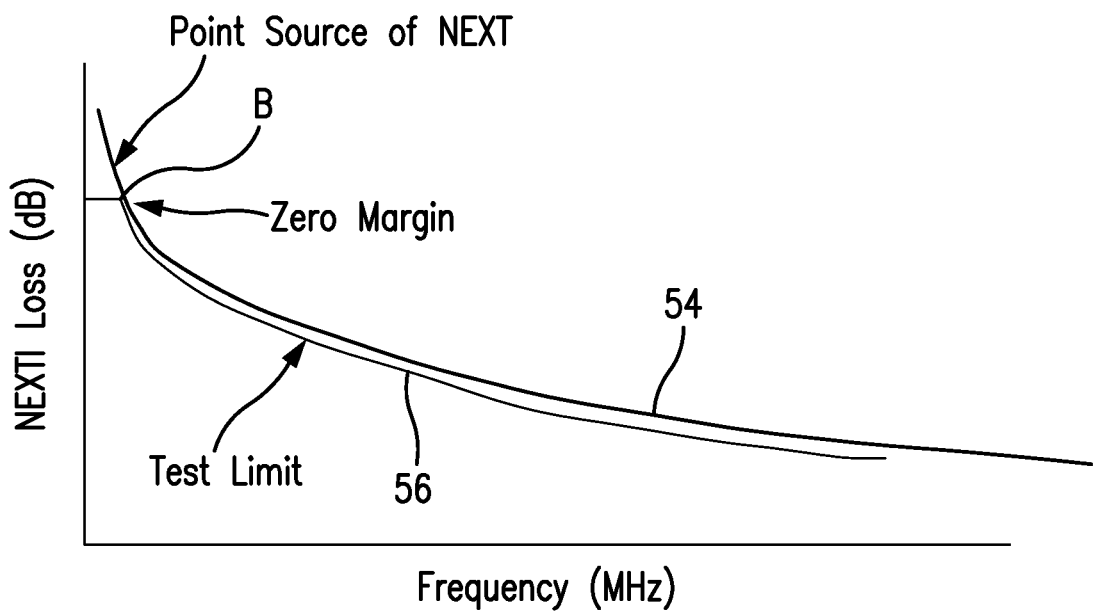

FIG. 13 demonstrates an example of a test limit (curve 56) and a NEXT loss (curve 54) as a function of frequency having a relatively steep slope and a zero margin at a point B.

Figure 14:
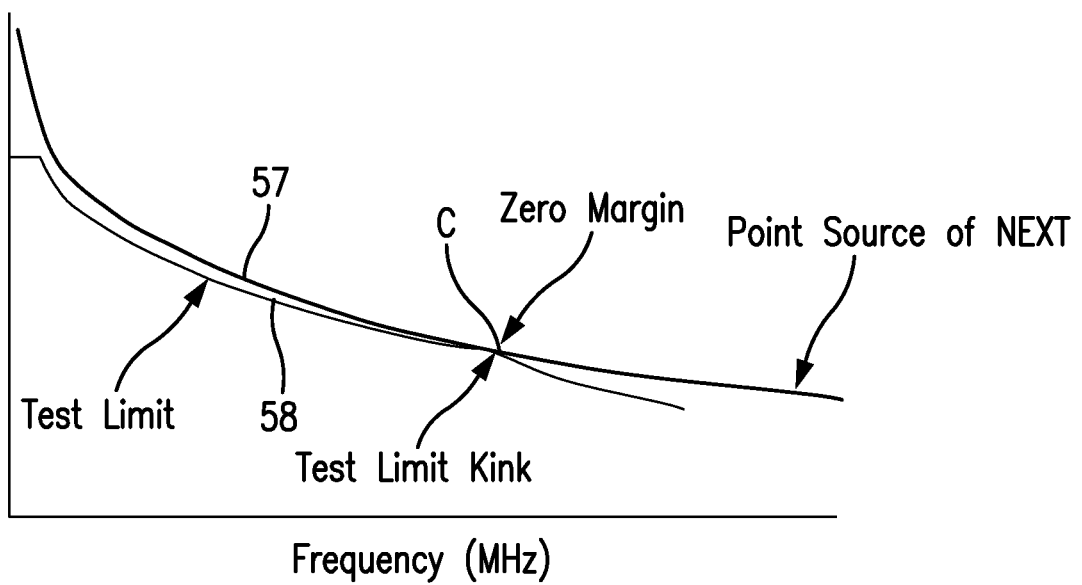

FIG. 14 demonstrates an example of a test limit (curve 59) and a NEXT loss (curve 58) as a function of frequency with a change of slope in the middle and a zero margin at a point C.

Moreover, above Equation 2 can be used to find the capacitance C which corresponds to a value of NEXT. To avoid storing and looking up the impedance Z, the coupling parameter CZ may be moved to the left side of the Equation 2. The move creates a new coupling parameter "CZ" as follows:

$$CZ = \frac{1}{\omega} \frac{2|NEXT|}{\sqrt{1 - 4|NEXT|^2}}. \quad (3)$$

It is to be appreciated the overall zero-margin CZ for a test limit may be found by applying Equation 3 to the NEXT limit at each frequency where the limit is defined. Thus, the smallest CZ may be determined as a zero-margin CZ for that particular limit and can be expressed as follows:

$$CZ_{ZeroMargin} = \min_{f}\left(\frac{1}{\omega} \frac{2|NEXT(f)_{TestLimit}|}{\sqrt{1 - 4|NEXT(f)_{TestLimit}|^2}}\right). \quad (4)$$

It follows from above Equation 4 that the zero-margin CZ is a property of the test limit only—it does not depend on the measured data. It also preferably does not depend on which adaptive window is chosen for the measured data. Therefore it can be computed in advance of the measurements and stored in a database (memory).

Furthermore, the midscale level on the TDX vertical scale may be defined as the TDX produced by a point source which fails the NEXT limit. This level of NEXT is also the level produced by the minimum failing capacitance, and can be computed as follows:

$$|NEXT(f)_{ZeroMargin}| = \sqrt{\frac{(\omega CZ_{ZeroMargin})^2}{4(1 + (\omega CZ_{ZeroMargin})^2)}}. \quad (5)$$

This zero margin NEXT may be processed into the TDX the same way as the measured data. That is, it can be windowed using the same chosen adaptive window selected by the above process. It is then transformed to the time domain by using an inverse FFT or the method of the U.S. Pat. No. 7,295,018 as discussed herein, which can be simplified by recognizing that the components are in-phase for an impulse, and only the first output of the transform is needed. With this recognition, the transform may be simplified to a sum which also incorporates the windowing as follows:

$$L_{50} = \frac{1}{N_{samples}} \sum_{window} |NEXT(f)_{ZeroMargin}| \times window(f), \quad (6)$$

where $L_{50}$ is time domain TDX amplitude that the minimum failing capacitance will produce.

Thus, according to above Equation 6, the scaled TDX is the transformed measured NEXT data divided by $L_{50}$. In one illustrative embodiment, the TDX may be displayed on a logarithmic scale, such that the center of the scale (50 units) corresponds to a level which fails the current limit, whereby the top of the scale (100 units) is 20 times larger, and the bottom of the scale (0 units) is twenty times smaller. Converting the TDX to a logarithmic scale with these properties may preferably be accomplished as follows:

$$TDX = 20 \log_{10}\left[\frac{(\text{measured, windowed, transformed NEXT})}{L_{50}}\right]\frac{50}{26} + 50. \quad (7)$$

Figure 15A:
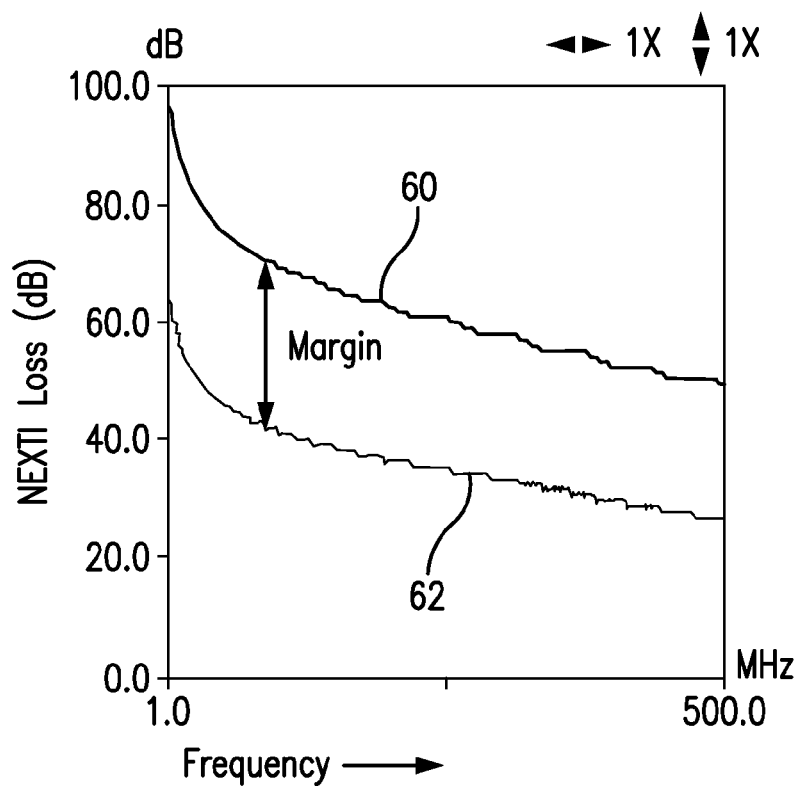
FIGS. 15A and 15B demonstrate TDX scaling on a logarithmic scale.
Figure 15B:
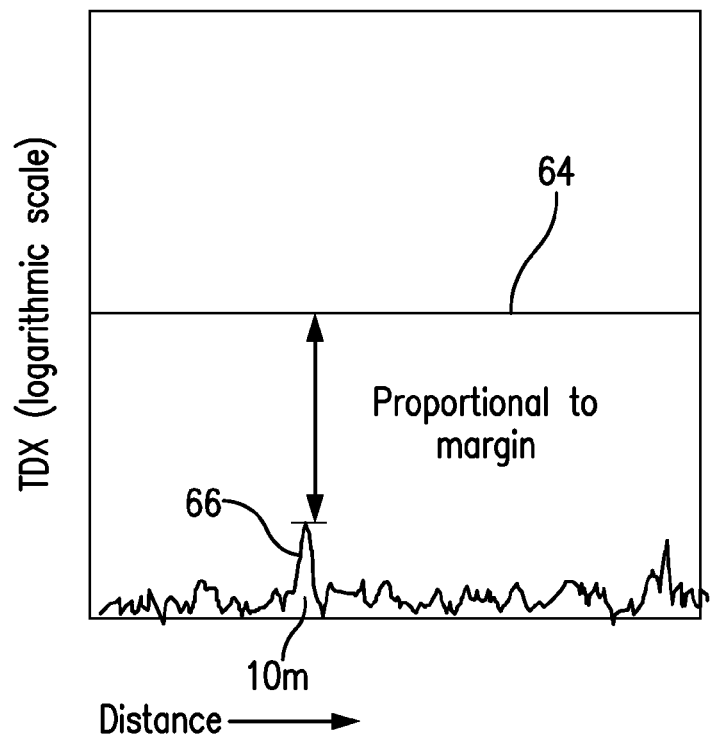

This scaling is demonstrated in FIGS. 15A and 15B. FIG. 15A shows a plot of the results of a NEXT measurement (curve 60) as a function of frequency, where curves 60 and 62 respectively extend from zero to 500 MHz. It is to be appreciated the curve 62 represents an example of the industry standard (test limit). A vertical scale in FIGS. 15A and 15b represents a loss in the NEXT measurements using positive dB units. FIG. 15B shows a corresponding TDX as a function of a distance (proportional to a signal propagation time) using a logarithmic scale (see above Equation 7). In FIG. 15B the performance of the cable is displayed relative to the applied test limit 64 as opposed to an absolute measure. For instance, a fault 66 is shown in reference to the test limit 64.

Figure 16:
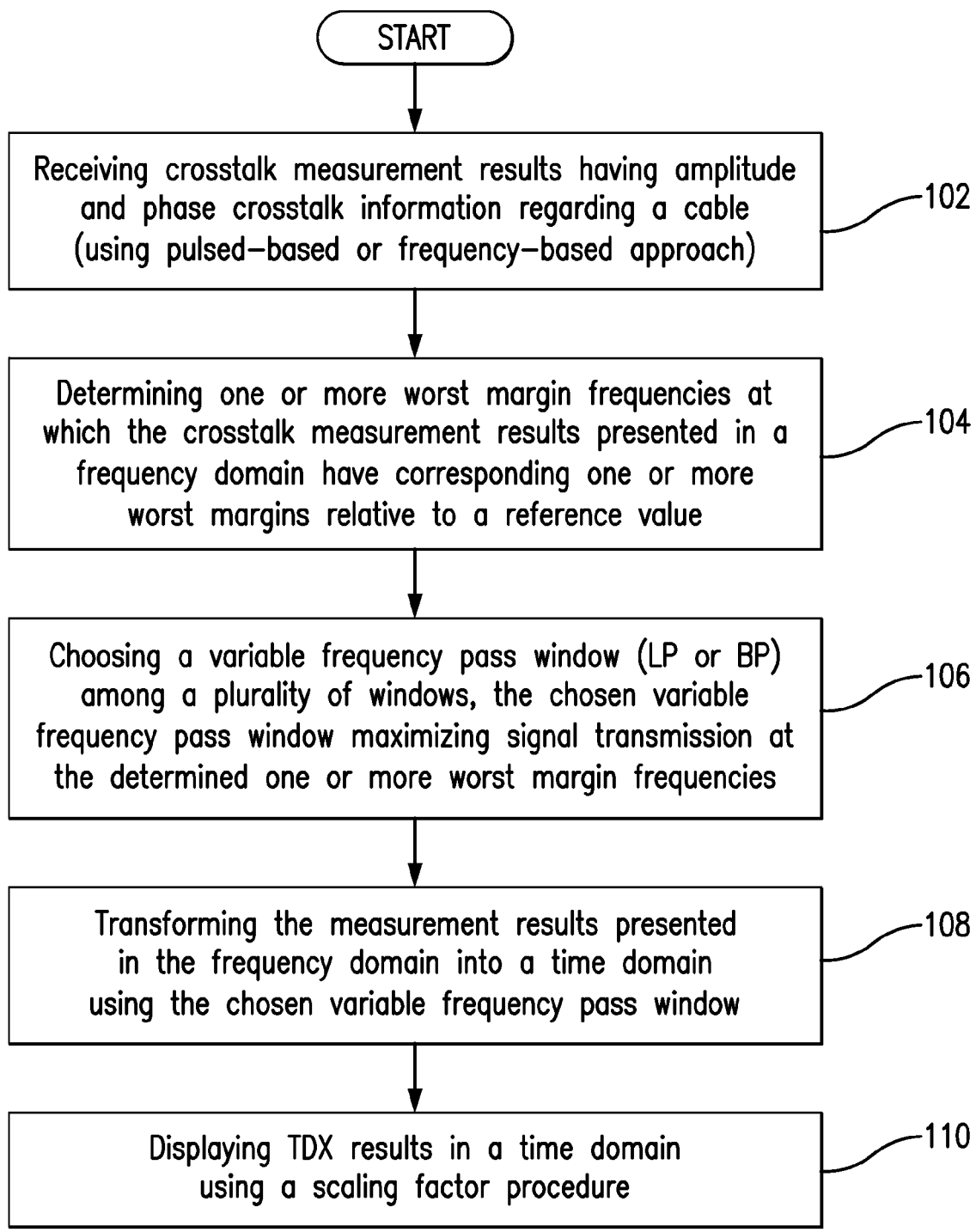
FIG. 16 depicts a flow chart illustrating implementation of various embodiments.

With reference now to FIG. 16, shown is a flow chart demonstrating implementation of the various illustrated embodiments. It is noted that the order of steps shown in FIG. 16 is not required, so in principle, the various steps may be performed out of the illustrated order. Also certain steps may be skipped, different steps may be added or substituted, or selected steps or groups of steps may be performed in a separate application following the embodiments described herein.

In a method according to the embodiment shown in FIG. 16, in a first step 102, an apparatus receives crosstalk measurement results having amplitude and phase crosstalk information such as NEXT regarding a cable (using pulsed-based or frequency-based approach).

In a next step 104, the apparatus determines one or more worst margin frequencies at which the crosstalk measurement results presented in a frequency domain have corresponding one or more worst margins relative to a reference value as described herein. It is noted that step 104 may also include initial Fourier Transform of the crosstalk measurement results acquired using a pulsed time domain technique.

In a next step 106, the apparatus chooses a variable frequency pass window (LP or BP) among a plurality of windows using predetermined criteria described herein, the chosen variable frequency pass window maximizing signal transmission at the determined one or more of worst margin frequencies.

In a next step 108, the apparatus transforms (e.g., using an inverse PIT or a method taught in U.S. Pat. No. 7,295,018 using a loss and distortion technique) the measurement results presented in the frequency domain into a time domain using the chosen variable frequency pass window.

In a next step 110, the apparatus displays TDX results in a time domain using a scaling factor procedure.

Figure 17:
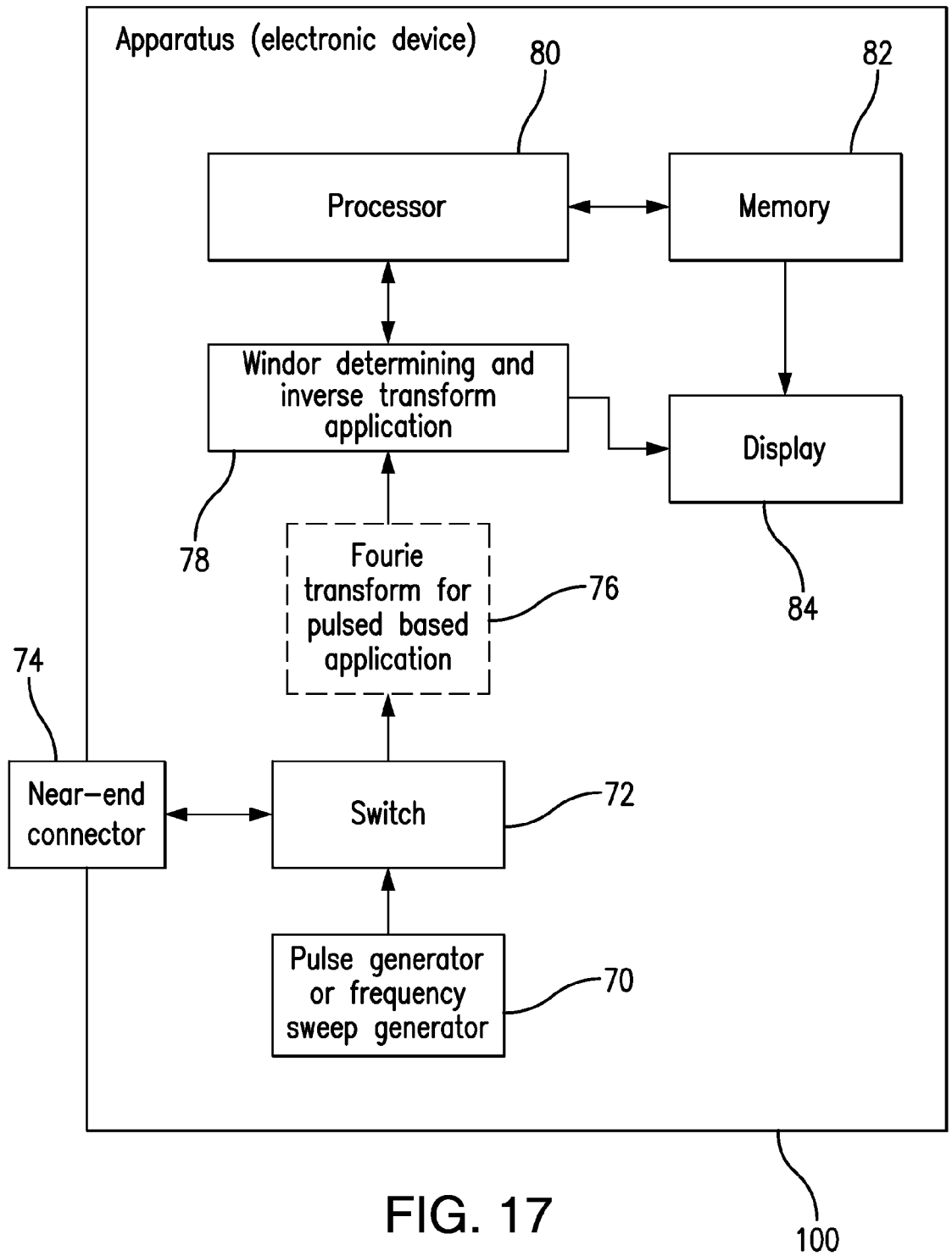
FIG. 17 depicts a block diagram of apparatus for implementation of various embodiments.

FIG. 17 shows an illustrative embodiment of a device or apparatus (or system) 100 which comprises a signal generator (pulsed generator or frequency sweep generator) 70, a switch 72, a near-end connector 74, an optional Fourier transform module 76, a window determining and inverse transform application module 78, a processor 80, at least one memory 82 and a display 84. It is to be understood and appreciated, the signal generator 70, the switch 72 and the near-end connector 74 are conventional devices/modules configured to provide measurement results received by the apparatus in step 102 of FIG. 16, and may be parts of the apparatus 100 or may be separate blocks/modules. The display 84 can be used in step 110 of FIG. 16 to display TDX results in the time domain using a scaling factor procedure (e.g., performed by the module 78 in step 110). Additionally, the display 84 can be a part of the apparatus 100 or be a separate module/device.

With reference now to FIG. 17, illustrated is a simplified block diagram of various components that are suitable for practicing the exemplary embodiments, and a specific manner in which components are configured to cause the illustrated embodiments herein to operate. For instance, and in accordance with the illustrated embodiments, a window determining and inverse transform application module 78 may preferably perform steps 102-110 shown in FIG. 16. The module 78 may be implemented as an application computer program stored in the memory 82, but in general it may be implemented as software, firmware and/or hardware module or a combination thereof. In particular, in the case of software or firmware, one embodiment may be implemented using a software related product such as a computer readable memory (e.g., non-transitory computer readable memory), computer readable medium or a computer readable storage structure comprising computer readable instructions (e.g., program instructions) using a computer program code (i.e., the software or firmware) thereon to be executed by a computer processor. Furthermore, the module 78 may be implemented as a separate block or may be combined with any other module/block of the apparatus 100, or it may be split into several blocks according to their functionality.

It is to be appreciated an optional Fourier transform module 76 may be used for pulsed-based implementation to perform Fourier transform (e.g., FFT) of the crosstalk measurement results acquired using pulsed time domain technique. The module 76 may preferably be implemented as an application computer program stored in the memory 82 (or may be implemented as software, firmware and/or hardware module or a combination thereof).

In particular, with respect to software or firmware, one embodiment may be implemented using a software related product such as a computer readable memory (e.g., non-transitory computer readable memory), computer readable medium or a computer readable storage structure comprising computer readable instructions (e.g., program instructions) using a computer program code (i.e., the software or firmware) thereon to be executed by a computer processor. Furthermore, the module 76 may be implemented as a separate block or may be combined with any other module/block (e.g., module 78) of the apparatus 100, or it may be split into several blocks according to their functionality.

Various embodiments of the at least one memory 82 (e.g., computer readable memory) may include any data storage technology type which is suitable to the local technical environment, including but not limited to semiconductor based memory devices, magnetic memory devices and systems, optical memory devices and systems, fixed memory, removable memory, disc memory, flash memory, DRAM, SRAM, EEPROM and the like. Various embodiments of the processor 80 may include but are not limited to general purpose computers, special purpose computers, microprocessors, digital signal processors (DSPs) and multi-core processors.

It is noted that various non-limiting embodiments described herein may be used separately, combined or selectively combined for specific applications.

Further, some of the various features of the above non-limiting embodiments may be used to advantage without the corresponding use of other described features. The foregoing description should therefore be considered as merely illustrative of the principles, teachings and exemplary embodiments of this invention, and not in limitation thereof.

It is to be understood that the above-described arrangements are to be understood as illustrative of the application of the principles of certain illustrated embodiments. Numerous modifications and alternative arrangements may be devised by those skilled in the art without departing from the scope of the invention, and the appended claims are intended to cover such modifications and arrangements.

What is claimed is:

1. A method, comprising:
receiving crosstalk measurement results having amplitude and phase crosstalk information regarding a cable;
determining one or more worst margin frequencies at which the crosstalk measurement results presented in a frequency domain have corresponding one or more worst margins relative to a reference value;
choosing a variable frequency pass window among a plurality of windows, the chosen variable frequency pass window maximizing signal transmission at the determined one or more worst margin frequencies; and
transforming the measurement results presented in the frequency domain into a time domain using the chosen variable frequency pass window.

2. The method of claim 1 wherein the crosstalk measurement results comprise information regarding near-end crosstalk of the cable.

3. The method of claim 2 wherein the near-end crosstalk is measured using at least two wire pairs in the cable.

4. The method of claim 1 wherein the crosstalk measurement results are collected in a frequency domain at discrete frequencies up to a maximum frequency.

5. The method of claim 1 wherein the crosstalk measurement results are collected in a time domain using a pulsed technique.

6. The method of claim 5 further comprising performing a Fourier transform of the crosstalk measurement results into the frequency domain prior to determining the one or more worst margin frequencies.

7. The method of claim 1 wherein the chosen variable frequency pass window is one of a band pass window and a low pass window.

8. The method of claim 1 wherein the chosen variable frequency pass window is a band pass window when the one or more of worst margin frequencies are above a maximum frequency minus a half of a number of samples in the band pass window, said chosen band pass window having a window's upper edge at the maximum frequency.

9. The method of claim 1 wherein transforming the measurement results presented in the frequency domain into the time domain using the chosen variable frequency pass window is performed using an inverse fast Fourier transform.

10. The method of claim 1 wherein transforming the measurement results presented in the frequency domain into the time domain is performed using a loss and distortion correction technique.

11. The method of claim 1 further comprising displaying the transformed measurement results in a time domain using a scaling factor procedure.

12. An apparatus comprising:
at least one processor and a memory storing a set of computer instructions, in which the processor and the memory storing the computer instructions are configured to cause the apparatus to:
receive crosstalk measurement results having amplitude and phase crosstalk information regarding a cable;
determine one or more worst margin frequencies at which the crosstalk measurement results presented in a frequency domain have corresponding one or more worst margins relative to a reference value;

choose a variable frequency pass window among a plurality of windows, the chosen variable frequency pass window maximizing signal transmission at the determined one or more worst margin frequencies; and transform the measurement results presented in the frequency domain into a time domain using the chosen variable frequency pass window.

13. The apparatus of claim 12 wherein the crosstalk measurement results comprise information regarding a near-end crosstalk of the cable.

14. The apparatus of claim 13 wherein the near-end crosstalk is measured using at least two wire pairs in the cable.

15. The apparatus of claim 12 wherein the crosstalk measurement results are collected in a frequency domain at discrete frequencies up to a maximum frequency.

16. The apparatus of claim 12 wherein the crosstalk measurement results are collected in a time domain using a pulsed technique whereby the computer instructions are further configured to cause the apparatus to perform a Fourier transform of the crosstalk measurement results into the frequency domain.

17. The apparatus of claim 12 wherein the chosen variable frequency pass window is a band pass window or a low pass window.

18. The apparatus of claim 12 wherein the computer instructions are further configured to cause the apparatus to transform the measurement results presented in the frequency domain into the time domain using a loss and distortion correction technique based on the chosen variable frequency pass window.

19. The apparatus of claim 12 wherein the computer instructions are further configured to cause the apparatus to display the transformed measurement results in a time domain using a scaling factor procedure.

20. A non-transitory computer readable storage medium and one or more computer programs embedded therein, the computer programs comprising instructions, which when executed by a computer system, cause the computer system to:

receive crosstalk measurement results having amplitude and phase crosstalk information regarding a cable;

determine one or more of worst margin frequencies at which the crosstalk measurement results presented in a frequency domain have corresponding one or more worst margins relative to a reference value;

choose a variable frequency pass window among a plurality of windows, the chosen variable frequency pass window maximizing signal transmission at the determined one or more worst margin frequencies; and transform the measurement results presented in the frequency domain into a time domain using the chosen variable frequency pass window.

* * * * *